US010659617B2

(12) United States Patent
Yasukawa et al.

(10) Patent No.: US 10,659,617 B2
(45) Date of Patent: *May 19, 2020

(54) BUILDING CONTROLLER AND INTERPHONE SYSTEM

(71) Applicant: AIPHONE CO., LTD., Nagoya-shi, Aichi (JP)

(72) Inventors: Kenji Yasukawa, Nagoya (JP); Syu Kumagai, Nagoya (JP)

(73) Assignee: AIPHONE CO., LTD., Nagoya-Shi, Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/345,606

(22) PCT Filed: Oct. 28, 2016

(86) PCT No.: PCT/JP2016/082156
§ 371 (c)(1),
(2) Date: Apr. 26, 2019

(87) PCT Pub. No.: WO2018/078819
PCT Pub. Date: May 3, 2018

(65) Prior Publication Data
US 2019/0342455 A1 Nov. 7, 2019

(51) Int. Cl.
*H04M 9/00* (2006.01)
*H04M 9/02* (2006.01)
(Continued)

(52) U.S. Cl.
CPC ............... *H04M 9/02* (2013.01); *E04H 1/04* (2013.01); *H03M 1/12* (2013.01); *H04M 11/025* (2013.01); *H04Q 1/30* (2013.01)

(58) Field of Classification Search
CPC .......... H04M 9/00; H04M 11/00; H04M 3/12; H04M 9/12; H04M 11/025
(Continued)

(56) References Cited

U.S. PATENT DOCUMENTS 5,754,637 A * 5/1998 Choi .................... H04M 11/025
379/167.11
2007/0047712 A1 3/2007 Gross et al.
(Continued)

FOREIGN PATENT DOCUMENTS

JP 2002-133562 A 5/2002
JP 2004201250 A 7/2004
(Continued)

OTHER PUBLICATIONS

Extended European Search Report for related EP App No. 16920340.3 dated Jul. 19, 2019, 8 pgs.
(Continued)

*Primary Examiner* — Binh Kien Tieu
(74) *Attorney, Agent, or Firm* — Procopio, Cory, Hargreaves & Savitch LLP

(57) ABSTRACT

In an intercom system to be used in an apartment complex configured by residential buildings and a centralized building that can communicate with the residential buildings, the residential buildings includes: residential room master devices disposed in residential rooms, collective entrance devices which can communicate with the residential room master devices; and a building controller. The building controller has: a building controller ID that, when the centralized building is called by one of the residential room master devices via the building controller, is used in recognition in which the centralized building recognizes the building controller; and a collective entrance device ID that, when the centralized building is called by one of the residential room master devices via the building controller, is used in recognition in which the one residential room master device recognizes the building controller as a virtual collective entrance device that is different from the collective entrance devices.

6 Claims, 7 Drawing Sheets

(51) Int. Cl.
*E04H 1/04* (2006.01)
*H03M 1/12* (2006.01)
*H04M 11/02* (2006.01)
*H04Q 1/30* (2006.01)

(58) Field of Classification Search
USPC .............. 379/102.06, 167.1, 167.11, 167.02,
379/167.05, 167.08, 167.12, 167.13,
379/167.14
See application file for complete search history.

(56) References Cited

U.S. PATENT DOCUMENTS

| | | |
|---|---|---|
| 2011/0007883 A1 | 1/2011 | Bingham et al. |
| 2014/0002236 A1* | 1/2014 | Pineau .................. H04W 12/06 340/5.6 |
| 2014/0219431 A1 | 8/2014 | Wagner et al. |

FOREIGN PATENT DOCUMENTS

| | | |
|---|---|---|
| JP | 2004-260679 A | 9/2004 |
| JP | 2006-238201 A | 9/2006 |
| JP | 2007-034657 A | 2/2007 |
| JP | 2010-178072 A | 8/2010 |

OTHER PUBLICATIONS

International Search Report and Written Opinion for related International Application No. PCT/JP2016/082156 dated Jan. 10, 2017; English translation of ISR provided; 8 pages.

* cited by examiner

Fig.6

RESIDENTIAL BUILDING A — BUILDING/OUTSIDE TABLE — 411a

| ROOM NUMBER | RESIDENTIAL ROOM MASTER DEVICE ID | CALL DESTINATION CENTRALIZED COLLECTIVE ENTRANCE DEVICE | CENTRALIZED COLLECTIVE ENTRANCE DEVICE ID |
|---|---|---|---|
| A101 | S1 | 50B | Y2 |
| A102 | S2 | 50C | Y3 |
| A103 | S3 | 50E | Y5 |
| ⋮ | | | ⋮ |

RESIDENTIAL BUILDING B — BUILDING/OUTSIDE TABLE

| ROOM NUMBER | RESIDENTIAL ROOM MASTER DEVICE ID | CALL DESTINATION CENTRALIZED COLLECTIVE ENTRANCE DEVICE | CENTRALIZED COLLECTIVE ENTRANCE DEVICE ID |
|---|---|---|---|
| B101 | T1 | 50C | Y3 |
| B102 | T2 | 50A | Y1 |
| B103 | T3 | 50C | Y3 |
| ⋮ | | | ⋮ |

⋮

RESIDENTIAL BUILDING E — BUILDING/OUTSIDE TABLE

| ROOM NUMBER | RESIDENTIAL ROOM MASTER DEVICE ID | CALL DESTINATION CENTRALIZED COLLECTIVE ENTRANCE DEVICE | CENTRALIZED COLLECTIVE ENTRANCE DEVICE ID |
|---|---|---|---|
| E101 | U1 | 50A | Y1 |
| E102 | U2 | 50E | Y5 |
| E103 | U3 | 50D | Y4 |
| ⋮ | | | ⋮ |

RESIDENTIAL BUILDING A            BUILDING/OUTSIDE TABLE

| MANAGEMENT ROOM NUMBER | MANAGEMENT ROOM MASTER DEVICE ID | CALL DESTINATION CENTRALIZED MANAGEMENT ROOM MASTER DEVICE | CENTRALIZED MANAGEMENT ROOM MASTER DEVICE ID |
|---|---|---|---|
| A20 | V1 | 60A | Z1 |

RESIDENTIAL BUILDING B            BUILDING/OUTSIDE TABLE

| MANAGEMENT ROOM NUMBER | MANAGEMENT ROOM MASTER DEVICE ID | CALL DESTINATION CENTRALIZED MANAGEMENT ROOM MASTER DEVICE | CENTRALIZED MANAGEMENT ROOM MASTER DEVICE ID |
|---|---|---|---|
| B20 | W1 | 60B | Z2 |

．
．
．
．
．

RESIDENTIAL BUILDING E            BUILDING/OUTSIDE TABLE

| MANAGEMENT ROOM NUMBER | MANAGEMENT ROOM MASTER DEVICE ID | CALL DESTINATION CENTRALIZED MANAGEMENT ROOM MASTER DEVICE | CENTRALIZED MANAGEMENT ROOM MASTER DEVICE ID |
|---|---|---|---|
| E20 | X1 | 60B | Z2 |

BUILDING CONTROLLER AND INTERPHONE SYSTEM

CROSS-REFERENCE TO RELATED APPLICATIONS

This application is a U.S. National Stage entry of PCT Application No. PCT/JP2016/082156 filed on Oct. 28, 2016, the contents of which are incorporated herein by reference.

TECHNICAL FIELD

The present invention relates to an intercom system which is to be used in an apartment complex, and a building controller which is to be mounted on an intercom system.

BACKGROUND ART

Conventionally, there is an intercom system for an apartment complex which is configured by a plurality of residential buildings and a centralized building. In an intercom system disclosed in Patent Literature 1, for example, a building controller which is connected to residential buildings, and which is disposed in a centralized building has a centralized system configuration that centrally manages call signals and the like transmitted from the residential buildings. In the configuration, when the number of residential buildings is increased, the processing power of the controller must be enhanced in accordance with the increasing number, and the cost is raised. Therefore, there is a distributed intercom system in which functions of a building controller of a centralized building that manages call signals are distributed among building controllers of residential buildings, a collective entrance device, a management room master device, and the like.

CITATION LIST

Patent Literature

Patent Literature 1: JP-A-2004-260679

SUMMARY OF INVENTION

Technical Problem

Residential room master devices are disposed in residential rooms constituting a residential building, respectively, and therefore largest in number among terminal devices constituting an intercom system. When a residential room master device can be used in both a centralized intercom system and a distributed intercom system, therefore, such a configuration is desirable in view of the cost, and the number of product types of residential room master devices can be prevented from being increased.

However, a conventional residential room master device which is designed for a centralized intercom system cannot recognize a building controller that is designed for a distributed intercom system. Therefore, a conventional residential room master device cannot be used also in a distributed intercom system.

Therefore, it is an object of the invention to provide a building controller and intercom system which enable a conventional residential room master device to be used also in a distributed intercom system.

Solution to Problem

In order to attain the object, the intercom system of the invention is an intercom system which is to be used in an apartment complex which is configured by a plurality of residential buildings and a centralized building that can communicate with the residential buildings, wherein each of the residential buildings includes:
residential room master devices which are disposed in residential rooms, respectively;
a plurality of terminal devices which can communicate with the residential room master devices; and
a building controller which communicably connects the residential room master devices of the residential rooms in an own building, with the plurality of terminal devices, and the building controller has:
first identification information that, when the centralized building is called by one of the residential room master devices via the building controller, is used in recognition in which the centralized building recognizes the building controller; and
second identification information that, when the centralized building is called by one of the residential room master devices via the building controller, is used in recognition in which the one residential room master device recognizes the building controller as a virtual terminal device that is different from the plurality of terminal devices.

According to the configuration, when the centralized building is called by one of the residential room master devices via the building controller, the one residential room master device can recognize the building controller as a virtual terminal device, by using the second identification information of the building controller, and therefore communication is established also between the building controller and the residential room master device. In this case, the centralized building can recognize the building controller as a communication target device, by using the first identification information of the building controller of the residential building, and can perform communication. According to the configuration, therefore, the residential room master device can communicate also with a building controller which is to be used in a distributed intercom system, and hence can be used also in a distributed intercom system.

In the intercom system of the invention, moreover,
the building controller may be configured so that the residential room master device of each of the residential rooms in the own building, and the plurality of terminal devices are communicably connected to each other via an intercom line, and
the plurality of residential buildings, and the centralized building may be connected to each other via a network in which communication is performed in accordance with a general-purpose protocol.

According to the configuration, when the centralized building is called by one of the residential room master devices via the building controller, the residential room master device and the building controller of the residential building can be connected to and communicate with each other by using the second identification information via the intercom line. In this case, the building controller of the residential building, and the centralized building can be connected to and communicate with each other by using the first identification information via the network in which communication is performed in accordance with a general-purpose protocol.

In the intercom system of the invention, moreover,
the building controller of each of the plurality of residential buildings may have:
a first converting section which performs a process of converting a signal that can be communicated via the intercom line in the own building, to a signal that can be communicated via the network in accordance with the general-purpose protocol; and
a second converting section which performs a process of converting a signal that can be communicated via the network in accordance with the general-purpose protocol, to a signal that can be communicated via the intercom line in the own building.

According to the configuration, even when different signal systems are used in the intercom lines of the residential buildings, the systems can be configured as one system via the network in which communication is performed in accordance with the general-purpose protocol.

In the intercom system of the invention, moreover,
the plurality of terminal devices may contain a collective entrance device, and,
when the centralized building is called by one of the residential room master devices via the building controller, the second identification information may be used in recognition in which the one residential room master device recognizes the building controller as a virtual collective entrance device that is different from the collective entrance device.

According to the configuration, when the centralized building is called by one of the residential room master devices via the building controller of the residential building, the building controller can communicate with the residential room master device while functioning as a virtual collective entrance device.

In the intercom system of the invention, moreover,
the plurality of terminal devices may contain a management room master device, and
the building controller may have third identification information that, when the centralized building is called by the management room master device via the building controller, is used in recognition in which the management room master device recognizes the building controller as a virtual management room master device that is different from the management room master device.

According to the configuration, when the centralized building is called by the management room master device via the building controller of the residential building, the building controller can communicate with the actual management room master device while functioning as a virtual management room master device.

The building controller of the invention has
the first identification information and second identification information in the intercom system.

According to the configuration, the residential room master device can be used in both a centralized intercom system and a distributed intercom system. Therefore, the configuration is desirable in view of the cost, not only in introduction of the intercom system but also in renewal. Moreover, the number of product types of residential room master devices can be prevented from being increased.

Advantageous Effects of Invention

According to the building controller and intercom system of the invention, a conventional residential room master device can be used also in a distributed intercom system.

BRIEF DESCRIPTION OF DRAWINGS

FIG. 6 is a view showing building/outside tables of centralized collective entrance device which are stored in building control units of residential building A to residential building E.
FIG. 7 is a view showing building/outside tables of centralized management room master devices which are stored in the building control units of the residential building A to residential building E.

Hereinafter, an exemplary embodiment will be described with reference to the drawings.

Figure 1:
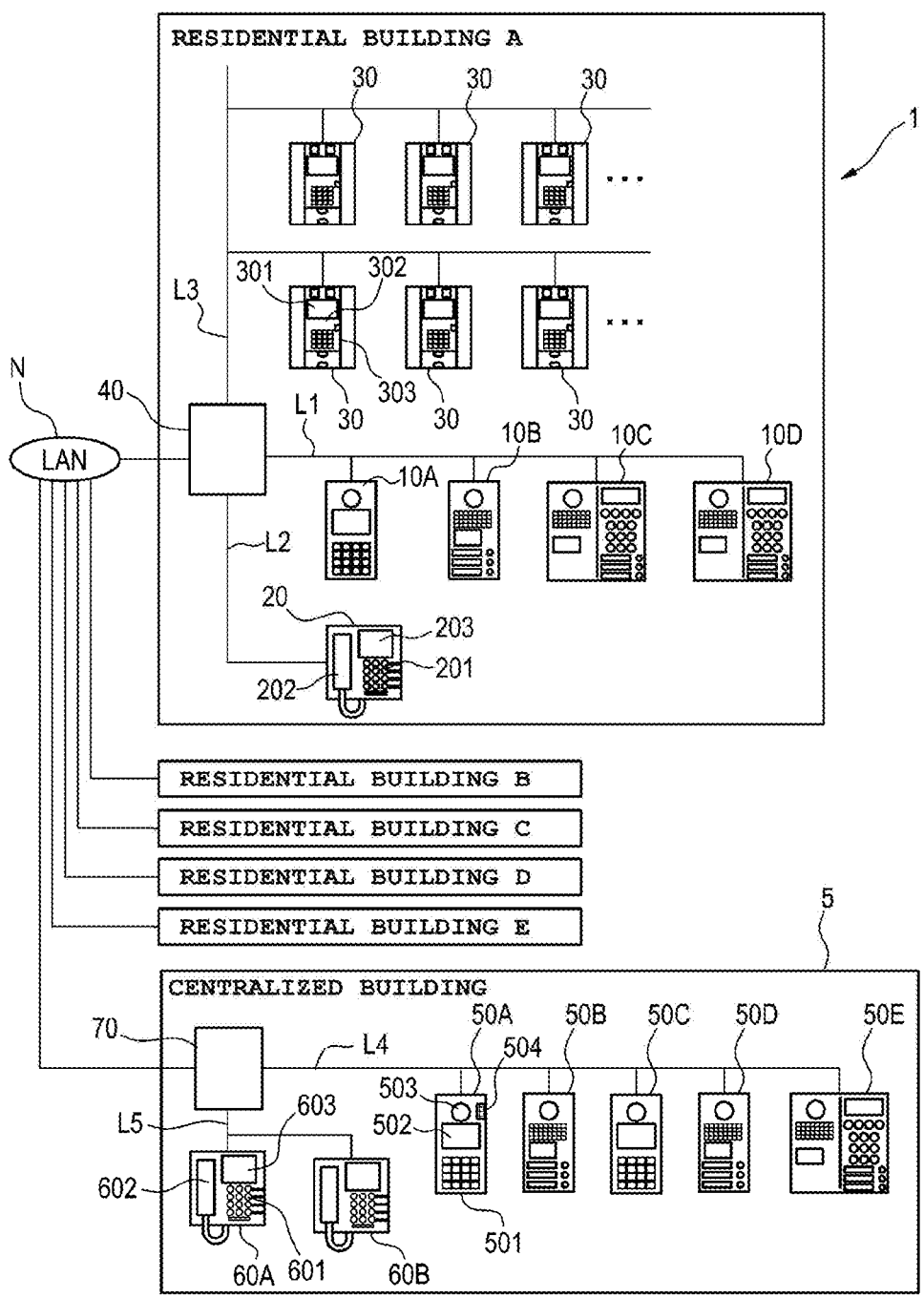
FIG. 1 is a diagram of an intercom system of an embodiment of the invention.

As shown in FIG. 1, an intercom system 1 is a system which is to be used in an apartment complex such as condominium buildings that is configured by: a plurality of residential buildings (in the embodiment, the residential building A to the residential building E); and a centralized building 5 through which a person passes before entering these residential buildings. Each of the residential building A to the residential building E includes collective entrance devices 10A to 10D (an example of the terminal devices), a management room master device 20 (an example of the terminal devices), residential room master devices 30, and a building control unit 40. The centralized building 5 includes centralized collective entrance devices 50A to 50E, centralized management room master devices 60A, 60B, and a centralized control unit 70. FIG. 1 in the embodiment shows the above-described configurations of only the residential building A. The residential buildings, and the residential buildings and the centralized building 5 are connected to each other via a network N (in the embodiment, an LAN: Local Area Network) in which communication is performed in accordance with a general-purpose protocol.

The collective entrance devices 10A to 10D are disposed in the entrance, shared space, or the like of the residential building. Each of the collective entrance devices 10A to 10D stores information (for example, a collective entrance device ID: identification) which identifies the collective entrance device. The collective entrance devices 10A to 10D are communicably connected to the building control unit 40 via an intercom line (a dedicated line) L1. Although, in FIG. 1 in the embodiment, the four collective entrance devices (the collective entrance devices 10A to 10D) are connected to the building control unit 40, the number of connected collective entrance devices is not limited to this.

The collective entrance devices 10A to 10D are configured so as to be able to call, for example, one of the residential room master devices 30 in the own building, and the management room master device 20 in the own building. Moreover, the collective entrance devices 10A to 10D are configured so as to be able to take an image of, for example, a visitor.

As the collective entrance devices, for example, there are devices in which a room number is input through a numeric keypad as indicated by the collective entrance device 10A, those in which one of dedicated buttons associated respectively with names is pressed as indicated by the collective entrance device 10B, and those in which both the numeric keypad system, and the systems of dedicated buttons are enabled as indicated by the collective entrance devices 10C, 10D.

The management room master device 20 is disposed in a management room of the residential building. The management room master device 20 includes an operating section 201, a conversation section 202, a displaying section 203, and the like. The management room master device 20 stores information (for example, a management room master device ID) which identifies the management device. The management room master device 20 is communicably connected to the building control unit 40 via an intercom line L2. A plural number of management room master devices may be connected to the building control unit 40.

The management room master device 20 is configured so as to be able to call, for example, one of the residential room master devices 30 in the own building. Moreover, the management room master device 20 is configured so as to be able to respond to a call from one of the collective entrance devices 10A to 10D in the own building, or one of the residential room master devices 30 in the own building. Moreover, the management room master device 20 is configured so as to be able to call one of the centralized collective entrance devices 50A to 50E, or centralized management room master device 60A or 60B in the centralized building 5. Moreover, the management room master device 20 is configured so as to be able to respond to a call from one of the centralized collective entrance devices 50A to 50E, or centralized management room master device 60A or 60B in the centralized building 5.

The residential room master devices 30 are disposed in residential rooms of the apartment complex, respectively. Each of the residential room master devices 30 includes a displaying section 301, an operating section 302, a conversation section 303, and the like. Each of the residential room master devices 30 stores information (for example, a residential room master device ID) which identifies the residential room device. The residential room master devices 30 are communicably connected to the building control unit 40 via an intercom line L3.

Each of the residential room master devices 30 is configured so as to be able to call, for example, one of the collective entrance devices 10A to 10D in the own building, or the management room master device 20 in the own building. Moreover, the residential room master device 30 is configured so as to be able to respond to a call from one of the collective entrance devices 10A to 10D in the own building, or the management room master device 20 in the own building. Moreover, the residential room master device 30 is configured so as to be able to call one of the centralized collective entrance devices 50A to 50E, or centralized management room master device 60A or 60B in the centralized building 5. Moreover, the residential room master device 30 is configured so as to be able to respond to a call from one of the centralized collective entrance devices 50A to 50E, or centralized management room master device 60A or 60B in the centralized building 5. Furthermore, the residential room master device 30 is configured so as to be able to call one of the residential room master devices 30 in the other buildings.

The building control unit 40 controls communications and the like between the collective entrance devices 10A to 10D, management room master device 20, and residential room master devices 30 in the own building which are connected to one another via the intercom lines. Moreover, the building control unit 40 controls communications and the like between the building control units 40 in the other residential buildings (in the embodiment, residential building B to the residential building E), and the centralized control unit 70 in the centralized building 5 which are connected to one another via the network N. A building controller of the building control unit 40 has information (for example, a building controller ID (an example of the first identification information)) which identifies the controller. Moreover, the building controller of the building control unit 40 has information (for example, a collective entrance device ID (an example of the second identification information)) which is used by the building controller to impersonate a virtual collective entrance device (in FIG. 1 in the embodiment, a fifth collective entrance device) in the own building which is different from the collective entrance devices 10A to 10D in the own building. Furthermore, the building controller has information (for example, a management room master device ID (an example of the third identification information)) which is used by the building controller to impersonate a virtual management room master device (in FIG. 1 in the embodiment, a second management room master device) in the own building which is different from the management room master device 20 in the own building.

The centralized collective entrance devices 50A to 50E are disposed in the entrance, shared space, or the like of the centralized building 5. Each of the centralized collective entrance devices 50A to 50E includes a calling section 501, a displaying section 502, a camera 503, a conversation section 504, and the like. Each of the centralized collective entrance devices 50A to 50E stores information (for example, a centralized collective entrance device ID) which identifies the entrance device. The centralized collective entrance devices 50A to 50E are communicably connected to the centralized control unit 70 via an intercom line L4. Although, in the embodiment, the five centralized collective entrance devices are connected to the centralized control unit 70, the number of connected centralized collective entrance devices is not limited to this.

The centralized collective entrance devices 50A to 50E are configured so as to be able to call, for example, one of the residential room master devices 30, and management room master devices 20 in the residential buildings. Moreover, the centralized collective entrance devices 50A to 50E are configured so as to be able to call the centralized management room master device 60A or 60B. Moreover, the centralized collective entrance devices 50A to 50E are configured so as to be able to respond to a call from one of the residential room master devices 30 and management room master devices 20 in the residential buildings. Moreover, the centralized collective entrance devices 50A to 50E are configured so as to be able to take an image of, for example, a visitor.

The centralized management room master devices 60A, 60B are disposed in a management room of the centralized building 5. Each of the centralized management room master devices 60A, 60B has an operating section 601, a conversation section 602, a displaying section 603, and the like. Each of the centralized management room master devices 60A, 60B stores information (for example, a centralized management room master device ID) which identifies the management device. The centralized management room master devices 60A, 60B are communicably connected to the centralized control unit 70 via an intercom line L5. Although, in the embodiment, the two centralized management room master devices are connected to the centralized control unit 70, the number of connected centralized management room master devices is not limited to this.

The centralized management room master devices 60A, 60B are configured so as to be able to call, for example, one of the residential room master devices 30, and management room master devices 20 in the buildings. Moreover, the centralized management room master devices 60A, 60B are configured so as to be able to respond to a call from one of the centralized collective entrance devices 50A to 50E. Moreover, the centralized management room master devices 60A, 60B are configured so as to be able to respond to a call from one of the management room master devices 20 and residential room master devices 30 in the buildings.

The centralized control unit 70 controls communications and the like between the centralized collective entrance devices 50A to 50E and centralized management room master devices 60A, 60B which are connected to one another via the intercom lines. Moreover, the centralized control unit 70 controls communications and the like between the building control units 40 in the residential buildings which are connected to one another via the network N.

Figure 2:
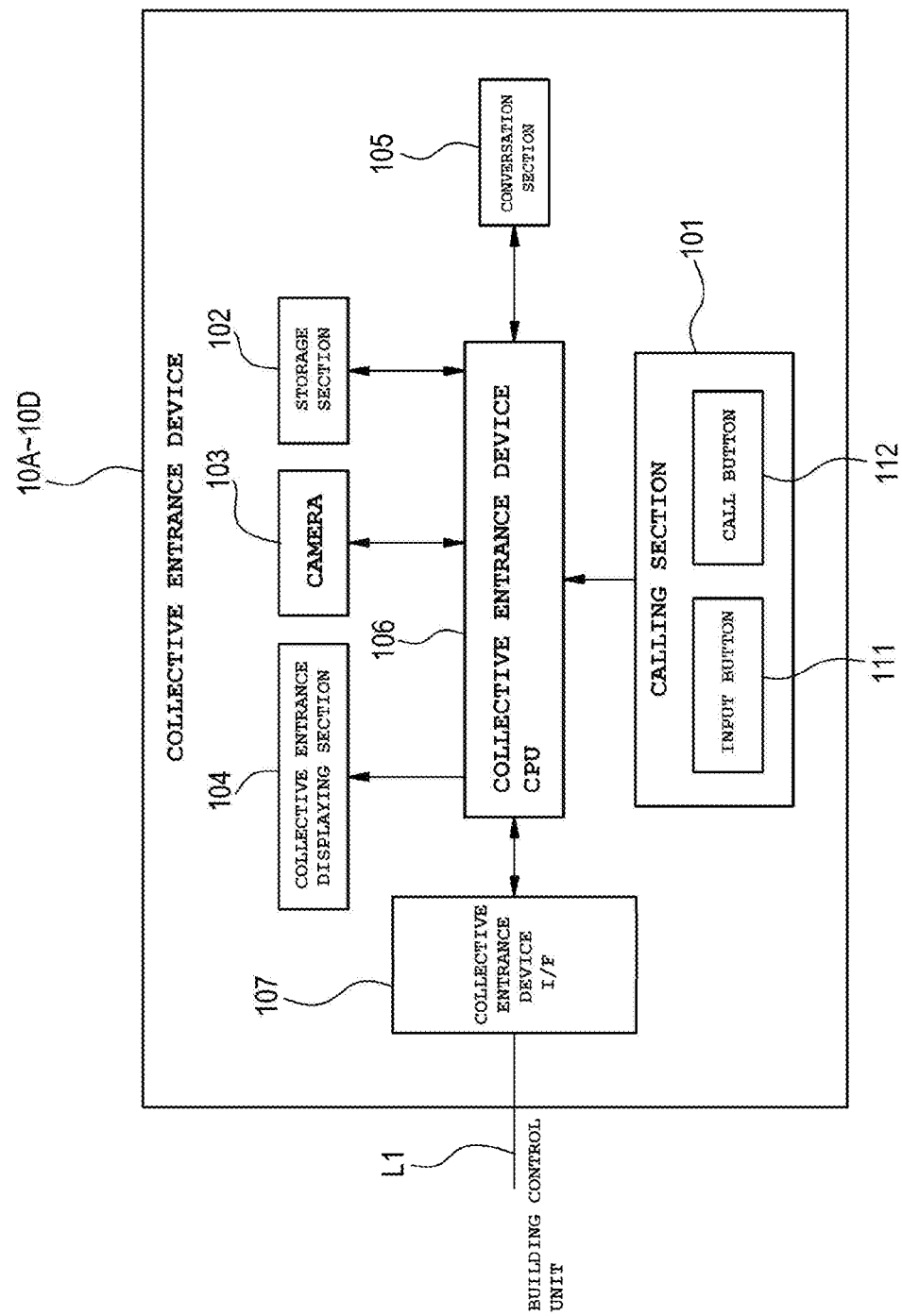
FIG. 2 is a functional block diagram of a collective entrance device.

As shown in FIG. 2, each of the collective entrance devices 10A to 10D includes a calling section 101, a storage section 102, a camera 103, a collective entrance displaying section 104, a conversation section 105, a collective entrance device CPU 106, and a collective entrance device interface (hereinafter, an interface is referred to as an I/F) 107.

The calling section 101 is operated when a visitor or the like is to call the residential room master device 30 of a visit destination, or the management room master device 20 in the management room. The calling section 101 has input buttons (a numeric keypad, dedicated buttons, or the like) 111 for inputting the call destination, a call button 112 which is to be operated after the input buttons are operated, and the like. The storage section 102 stores a call table in which room numbers of residential rooms in the own building, the names of residents of the residential rooms or the names (for example, the names of tenants) of the residential rooms, and residential room master device IDs identifying respectively the residential room master devices 30 of the residential rooms are associated with one another. The camera 103 takes an image of a visitor or the like who operates one of the collective entrance devices 10A to 10D. The collective entrance displaying section 104 displays the room number which is input from the calling section 101, a message to a visitor, an image of the visitor which is being taken by the camera 103, and the like. The conversation section 105 is configured by a microphone and speaker which are used for conversation with a resident or a building manager.

The collective entrance device CPU 106 performs processing for controlling the operations of the components constituting the collective entrance devices 10A to 10D. When a room number or a name is input, for example, the collective entrance device CPU 106 converts the input signal to the residential room master device ID of the residential room master device 30 of the call destination, based on the call table. The collective entrance device I/F 107 forms a bidirectional signal transmission line between the collective entrance device CPU 106 and the intercom line L1.

Although not illustrated, similarly with the collective entrance devices 10A to 10D, also the management room master device 20 has a storage section which stores a call table, and is configured so as to, when a signal such as that indicating a room number or a name is input through the operating section 201, transmit the residential room master device ID which has been converted based on the call table, to the residential rooms in the own building.

Figure 3:
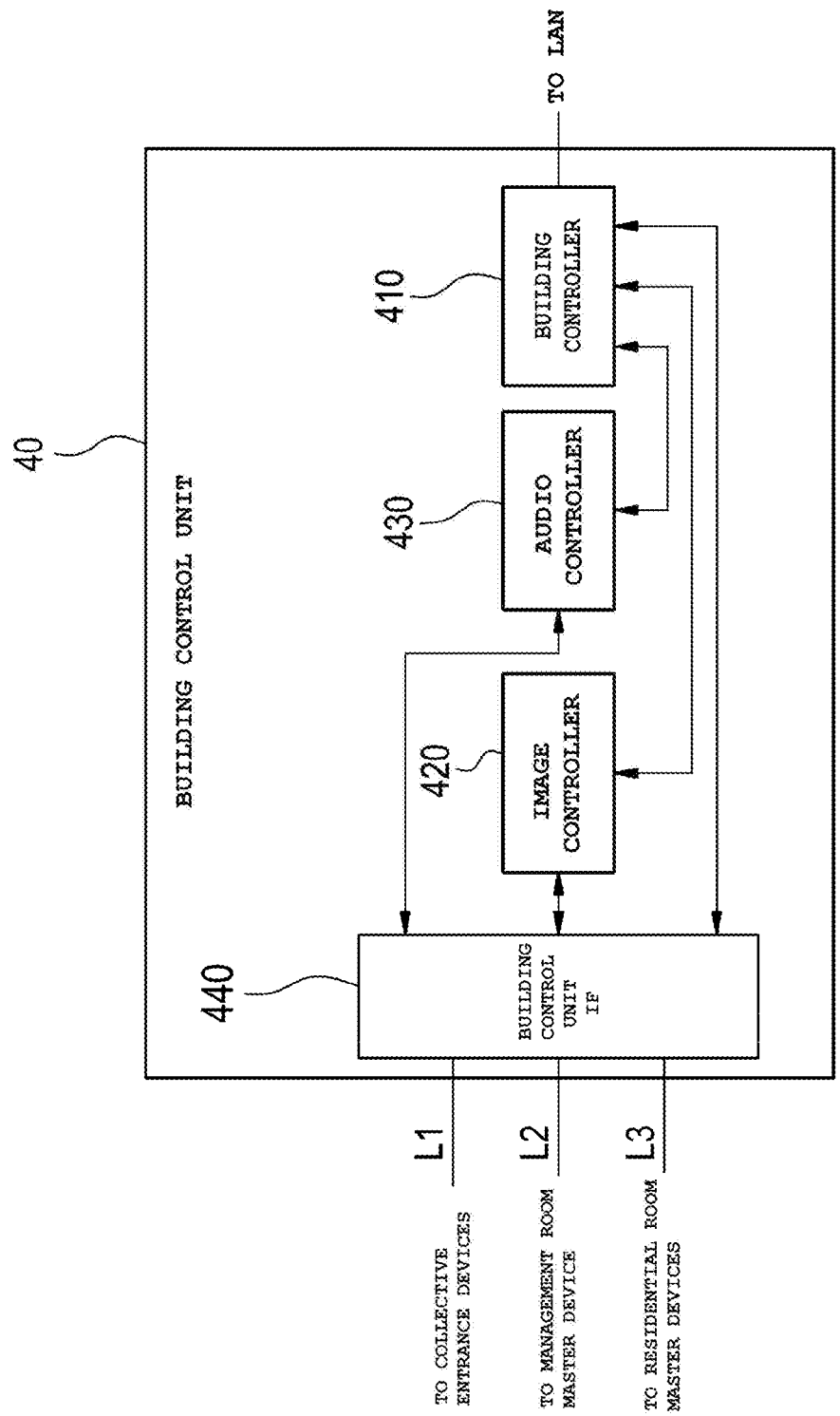
FIG. 3 is a functional block diagram of a building control unit.
Figure 4:
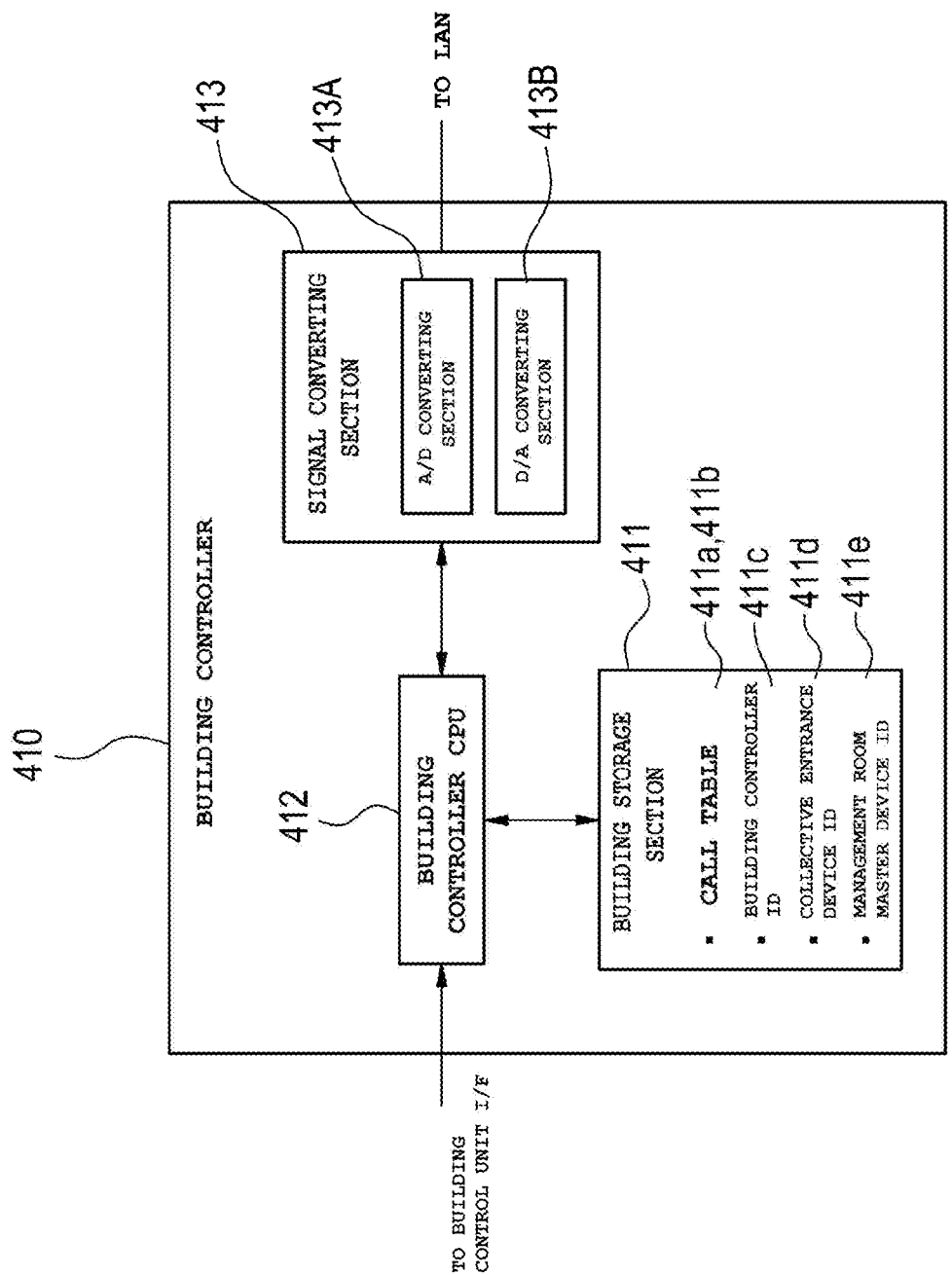
FIG. 4 is a functional block diagram of a building controller.

As shown in FIG. 3, the building control unit 40 includes a building controller 410, an image controller 420, an audio controller 430, and a building control unit I/F 440. As shown in FIG. 4, moreover, the building controller 410 includes a building storage section 411, a building controller CPU 412, and a signal converting section 413.

The building storage section 411 of the building controller 410 stores a building/outside table 411a in which, in the case where one of the centralized collective entrance devices 50A to 50E of the centralized building 5 is called by the residential room master device 30, the residential room master device 30 which is the call source, and the centralized collective entrance devices 50A to 50E which are call destinations are associated with one another. In each of the residential rooms, a centralized collective entrance device which is to be called by the residential room master device 30 is predetermined depending on setting. For example, the setting is made so that, in the case where the residential room master device 30 of room 101 of the residential building A performs an operation of calling one of the centralized collective entrance devices, the centralized collective entrance device 50B of the centralized collective entrance devices 50A to 50E is called. The setting of a centralized collective entrance device to be called can be changed in accordance with the request of the resident.

The building storage section 411 further stores a building/outside table 411b in which, in the case where one of the centralized management room master devices 60A, 60B of the centralized building 5 is called by the management room master device 20, the management room master device 20 which is the call source, and the centralized management room master devices 60A, 60B which are call destinations are associated with one another. Also in this case, similarly with the above, a centralized management room master device which is to be called by the management room master device 20 is predetermined depending on setting. In FIG. 1 in the embodiment, the centralized management room master device which is to be called is determined to be either the centralized the centralized management room master devices 60A or 60B.

Moreover, the building storage section 411 stores: the building controller IDs 411c identifying respectively the building controllers 410 of the residential buildings; the collective entrance device IDs 411d which are used by the building controllers 410 for impersonating a virtual collective entrance device that is different from the collective entrance devices 10A to 10D in the own building; and the management room master device IDs 411e which are used by the building controllers 410 for impersonating a virtual management room master device that is different from the management room master device 20 in the own building. The building storage section 411 further stores the centralized collective entrance device IDs identifying respectively the centralized collective entrance devices 50A to 50E of the centralized building 5, and the centralized management room master device IDs identifying respectively the centralized management room master devices 60A, 60B.

The building controller CPU 412 performs processing for controlling the operations of the components constituting the building controller 410. When a signal for calling a centralized collective entrance device is transmitted from the residential room master device 30, for example, the building controller CPU 412 converts the transmitted signal to the centralized collective entrance device ID of one of the centralized collective entrance devices 50A to 50E which is the call destination, based on the building/outside table 411a. When a signal for calling a centralized management room master device is transmitted from the management room master device 20, moreover, the building controller CPU 412 converts the transmitted signal to the centralized management room master device ID of the centralized management room master devices 60A or 60B which is the call destination, based on the building/outside table 411b.

The signal converting section 413 is a circuit for mutually converting a signal which is used in the intercom lines L1 to L3 and that which is used in the network N. The signal converting section 413 has an analog/digital converting section 413A (an example of the first converting section), and a digital/analog converting section 413B (an example of the second converting section). The analog/digital converting section 413A (hereinafter, analog/digital is referred to as A/D) converts an analog signal which can be communicated through the intercom lines L1 to L3 in the residential buildings, to a digital signal which can be communicated in the network N that is between the residential buildings, and the residential buildings and the centralized building. By contrast, the digital/analog converting section 413B (hereinafter, digital/analog is referred to as D/A) converts a digital signal which can be communicated in the network N that is between the residential buildings, and the residential buildings and the centralized building, to an analog signal which can be communicated through the intercom lines in each of the residential buildings.

The image controller 420 performs signal processing on image signals which are taken by the cameras 103 of the collective entrance devices 10A to 10D, and an image signal which has been transmitted from the centralized building 5, and transmits the processed image signals toward the residential room master devices 30 or management room master device 20 in the own building. The audio controller 430 performs audio processing on audio signals which have been transmitted from the conversation sections 105 of the collective entrance devices 10A to 10D, the conversation section 202 of the management room master device 20, and the centralized building 5, and transmits the processed audio signals toward the residential room master devices 30 or management room master device 20 in the own building. The building control unit I/F 440 forms a bidirectional signal transmission line between the building controller 410, the image controller 420, and the audio controller 430, and the intercom lines L1 to L3.

Figure 5:
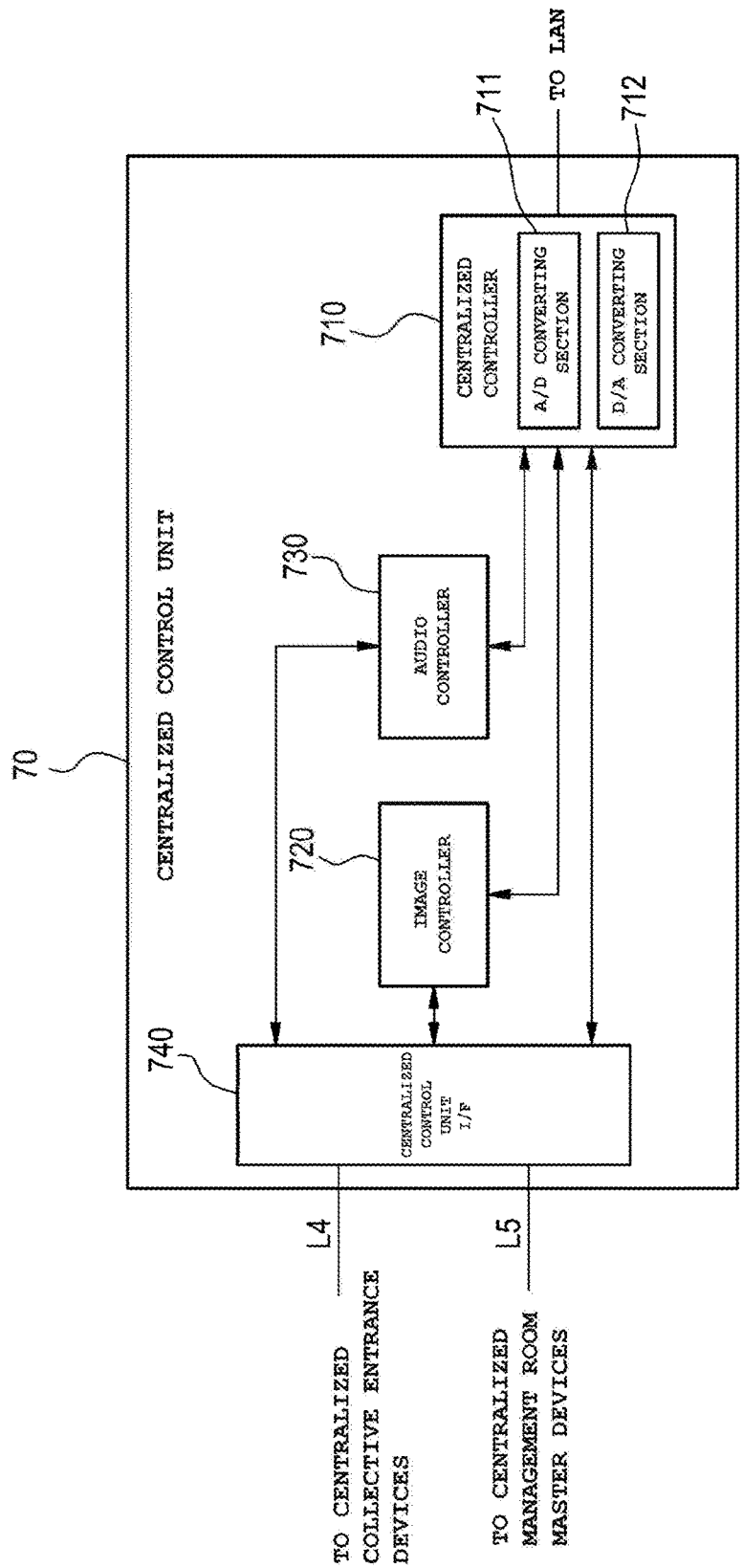
FIG. 5 is a functional block diagram of a centralized control unit.

As shown in FIG. 5, the centralized control unit 70 includes a centralized controller 710, an image controller 720, an audio controller 730, and a centralized control unit I/F 740. The centralized controller 710 includes an A/D converter 711 and a D/A converter 712.

The A/D converter 711 of the centralized controller 710 converts an analog signal which can be communicated through the intercom lines L4, L5 in the centralized building 5, to a digital signal which can be communicated through the network N between the centralized building 5 and the residential buildings. By contrast, the D/A converter 712 converts a digital signal which can be communicated through the network N between the centralized building 5 and the residential buildings, to an analog signal which can be communicated through the intercom lines L4, L5 in the centralized building 5.

The image controller 720 performs signal processing on image signals which are taken by the cameras 503 of the centralized collective entrance devices 50A to 50E, and transmits the processed image signals toward the building controllers 410 of the residential buildings. The audio controller 730 performs audio processing on audio signals which are transmitted from the conversation sections 504 of the centralized collective entrance devices 50A to 50E, and those which are transmitted from the conversation sections 602 of the centralized management room master devices 60A, 60B, and transmits the processed audio signals toward the building controllers 410 of the residential buildings. The centralized control unit I/F 740 forms a bidirectional signal transmission line between the centralized controller 710, the image controller 720, and the audio controller 730, and the intercom lines L4, L5.

Next, the operation of the intercom system 1 will be described with reference to FIGS. 6 and 7.

Operation Example 1

In the example, an operation example in the case where the centralized collective entrance device 50B of the centralized building 5 is called by the residential room master device 30 of room 101 of the residential building A will be described.

A signal for calling the centralized collective entrance device 50B of the centralized building 5 is input through the operating section 302 of the residential room master device 30, and then the call button is pressed. The input call signal such as "50B" is transmitted to the building controller 410 of the building control unit 40 via the intercom line L3. In this case, in order to communicate with the residential room master device 30 via the intercom line, the building controller 410 functions as a virtual collective entrance device which is different from the collective entrance devices 10A to 10D in the own building, and performs communication in the same manner as the case where the building controller communicates with one of the collective entrance devices 10A to 10D in the own building. The residential room master device ID identifying the residential room master device 30 of room 101 of the residential building A which is the transmission source is added to the call signal "50B" which is to be transmitted.

In the building controller 410 of the building control unit 40, the building controller CPU 412 detects the residential room master device ID which is added to the call signal "50B," and converts the call signal "50B" to a call signal such as "Y2" that is the centralized collective entrance device ID of the centralized collective entrance device 50B that is the call destination, based on the building/outside table 411a (see FIG. 6) which is stored in the building storage section 411. As shown in FIG. 6, the embodiment is preset so that, when a centralized collective entrance device is called by the residential room master device 30 of room 101 of the residential building A, the centralized collective entrance device 50B is called, and, when a centralized collective entrance device is called by the residential room master device 30 of room 102, the centralized collective entrance device 50C is called.

In the building controller 410, then, the A/D converting section 413A converts the call signal "Y2" which is an analog signal that can be communicated through the intercom line, to a call signal "Y2" which is a digital signal that can be communicated through the network N. The building controller 410 transmits the converted call signal "Y2" toward the centralized building 5 via the network N. The building controller ID 411c identifying the building controller 410 of the residential building A is added to the call signal "Y2" which is to be transmitted.

In the centralized control unit 70 of the centralized building 5, the D/A converter 712 of the centralized controller 710 converts the call signal "Y2" which has been transmitted from the building controller 410, to an analog signal. The centralized controller 710 detects the building controller ID 411*c* which is added to the call signal "Y2," and recognizes that the building controller which is the transmission source is the building controller 410 of the residential building A. The centralized controller 710 transmits the call signal "Y2" to the centralized collective entrance device 50B via the intercom line L4.

The centralized collective entrance device 50B which has received the call signal "Y2" determines whether or not "Y2" coincides with the centralized collective entrance device ID stored in the own device. In the centralized collective entrance device 50B which determines that the coincidence is achieved, the camera 503 is activated, and imaging (monitoring) of the circumference of the centralized collective entrance device 50B is started. The centralized collective entrance device ID of the centralized collective entrance device 50B is added to the taken image signal, and then the image signal is transmitted to the centralized control unit 70 via the intercom line L4. The image signal is further converted to a digital signal by the centralized control unit 70, and then transmitted toward the building control unit 40 of the residential building A via the network N.

In the building controller 410 of the residential building A, the D/A converting section 413B converts the received image signal to an analog signal. Then, the building controller CPU 412 of the building controller 410 detects the centralized collective entrance device ID which is added to the image signal, and recognizes that the transmission source of the image signal is the centralized collective entrance device 50B. In order to communicate with the residential room master device 30 of room 101 which is the call source, via the intercom lines, then, the building controller CPU 412 determines that the building controller impersonates a virtual collective entrance device which is different from the collective entrance devices 10A to 10D in the own building.

The building controller CPU 412 transmits the image signal to which the collective entrance device ID 411*d* that is used for impersonating a virtual collective entrance device is added, toward the residential room master device 30 of room 101 via the intercom line L3.

The residential room master device 30 of room 101 detects the collective entrance device ID 411*d*, and recognizes that the counterparty which is currently connected is a virtual collective entrance device that is different from the collective entrance devices 10A to 10D in the own building. The residential room master device 30 communicates with the building controller 410 which is the virtual collective entrance device, via the intercom lines in the same manner as the case where the residential room master device communicates with one of the collective entrance devices 10A to 10D in the own building. Therefore, communication between the residential room master device 30 of room 101 of the residential building A and the centralized collective entrance device 50B of the centralized building 5 is established via the building control unit 40. An image which is taken (monitored) by the camera 503 of the centralized collective entrance device 50B is displayed on the displaying section 301 of the residential room master device 30.

Also in the case where the centralized management room master device 60A or 60B of the centralized building 5 is called by the residential room master device 30 of the residential building, the building controller CPU 412 operates while impersonating a virtual collective entrance device in a similar manner as the case where one of the centralized collective entrance devices 50A to 50E is called.

Operation Example 2

In the case where the centralized management room master device 60A of the centralized building 5 is called by the management room master device 20 of the residential building A, next, the intercom system 1 operates in the following manner.

A signal for calling the centralized management room master device 60A of the centralized building 5 is input through the operating section 201 of the management room master device 20, and the call button is pressed. The input call signal such as "60A" is transmitted to the building control unit 40 via the intercom line L2. In this case, the management room master device 20 detects the management room master device ID 411*e*, and recognizes that the counterparty which is currently connected is a virtual management room master device that is different from the management room master device 20 in the own building. The management room master device 20 communicates with the building controller 410 which is the virtual management room master device, via the intercom lines in the same manner as the case where the management room master devices in the own building communicate with each other. The management room master device ID identifying the management room master device 20 of the residential building A which is the transmission source is added to the call signal "60A" which is to be transmitted.

In the building controller 410 of the building control unit 40, the building controller CPU 412 detects the management room master device ID which is added to the call signal "60A," and converts the call signal "60A" to a call signal such as "Z1" that is the centralized management room master device ID of the centralized management room master device 60A which is the call destination, based on the building/outside table 411*b* (see FIG. 7) that is stored in the building storage section 411.

In the building controller 410, then, the A/D converting section 413A converts the call signal "Z1" which is an analog signal, to a call signal "Z1" which is a digital signal. The building controller 410 transmits the converted call signal "Z1" toward the centralized building 5 via the network N. The building controller ID 411*c* identifying the building controller 410 of the residential building A is added to the call signal "Z1" which is to be transmitted.

In the centralized control unit 70 of the centralized building 5, the D/A converter 712 of the centralized controller 710 converts the call signal "Z1" which has been transmitted from the building controller 410, to an analog signal. The centralized controller 710 detects the building controller ID 411*c* which is added to the call signal "Z1," and recognizes that the building controller that is the transmission source is the building controller 410 of the residential building A. The centralized controller 710 transmits the call signal "Z1" to the centralized management room master devices 60A, 60B via the intercom line L5.

The centralized management room master devices 60A, B which have received the call signal "Z1" determine whether or not "Z1" coincides with the centralized management room master device ID that is stored in the own device. In the centralized management room master device 60A which determines that the coincidence is achieved, a call sound is output, a call lamp is lit on, and characters are displayed on the displaying section 603, thereby notifying that the call has been performed from the management room master device 20 of the residential building A.

In the centralized management room master device 60A, when a conversation enabling button is pressed in response to the notification by the call sound and the like, signal communication between the management room master device 20 and the centralized management room master device 60A is enabled to allow, for example, voice conversation.

Also in the case where the centralized collective entrance devices 50A to 50E of the centralized building 5 is called by the management room master device 20 of each of the residential buildings, the building controller CPU 412 operates while impersonating a virtual management room master device, in a similar manner as the case where the centralized management room master device 60A or 60B is called.

Others

Also in the case where one of the residential room master devices 30 of a certain residential building (in the example, the residential room master device 30 of room 103 of the residential B) calls one of the residential room master devices 30 of another building (in the example, the residential room master device 30 of room 101 of the residential building A), similarly, the building controller 410 operates as a virtual collective entrance device with respect to the residential room master device 30.

In an apartment complex configured by a plurality of buildings, a residential room master device which is used in a centralized intercom system is configured so as to be able to mutually communicate with collective entrance devices and management room master device in the own building. When the residential room master device is to be used in a distributed intercom system, however, the residential room master device cannot recognize building controllers which are disposed in the buildings, and therefore cannot communicate with the building controllers.

According to the intercom system 1 which is configured as described above, when one of the centralized collective entrance devices 50A to 50E is called by the residential room master device 30 via the building controller 410, by contrast, the residential room master device 30 can recognize the building controller 410 as a virtual collective entrance device by using the collective entrance device ID 411d of the building controller 410, and therefore communication is established also between the building controller 410 and the residential room master device 30. In this case, on the other hand, the centralized building 5 can recognize the building controller as a communication target device by using the building controller ID 411c of the building controller 410 of the residential building, and perform communication. When the centralized management room master device 60A or 60B is called by the management room master device 20 via the building controller 40, similarly, the management room master device 20 can recognize the building controller 410 as a virtual management room master device, by using the management room master device ID 411e of the building controller 40, and therefore communication is established also between the building controller 410 and the management room master device 20. Also when the residential room master device 30 of another building is called by the residential room master device 30 via the building controller 410, moreover, similar operations are performed. Therefore, the residential room master device 30 which is configured in the same manner as a conventional one can communicate with the building controller 410 that is used in a distributed intercom system.

When the centralized building 5 is called by the residential room master device 30 (the management room master device 20) via the building controller 410, the residential room master device 30 (the management room master device 20) and the building controller 410 of the residential building can be connected to and communicate with each other by using the collective entrance device ID (the management room master device ID) via the intercom line L3 (L2). In this case, the building controller 410 of the residential building, and the centralized building 5 can be connected to and communicate with each other by using the building controller ID via the network N in which communication is performed in accordance with a general-purpose protocol.

In the building controller 410 of each of the residential buildings, the A/D converting section 413A and D/A converting section 413B which can mutually convert an analog signal that is communicable through an intercom line, and a digital signal that is communicable in a network are disposed. Even when different signal systems are used in intercom lines of residential buildings, respectively, for example, the systems therefore can be configured as one system via the network N in which communication is performed in accordance with the general-purpose protocol.

According to the intercom system 1, as described above, the residential room master device 30 which is configured in the same manner as a conventional one can be used in both a centralized intercom system and a distributed intercom system. According to the building controller 410 of the above-described building control unit 40, the residential room master device 30 can be used in both a centralized intercom system and a distributed intercom system. Therefore, the configuration is desirable in view of the cost, not only in introduction of the intercom system but also in renewal. Moreover, the number of product types of residential room master devices 30 can be prevented from being increased.

The invention is not limited to the above-described embodiment, and may be adequately subjected to modifications, improvements, and the like. In addition, the materials, shapes, dimensions, values, forms, numbers, installation places, and the like of the components of the above-described embodiment are arbitrary and not limited insofar as the invention can be achieved.

In the case where, in operation example 1, one of the centralized collective entrance devices 50A to 50E is called by the residential room master device 30, for example, the building controller 410 may impersonate, for example, a virtual management room master device. In the case where, in operation example 2 above, the centralized collective entrance device device 60A or 60B is called by the management room master device 20, similarly, the building controller 410 may impersonate, for example, a virtual collective entrance device.

1: intercom system, 5: centralized building, 10A to 10D: collective entrance device (example of terminal device), 20: management room master device (example of terminal device), 30: residential room master device, 40: building control unit, 50A to 50E: centralized collective entrance device, 60A, 60B: centralized management room master device, 70: centralized control unit, 410: building controller, 411c: building controller ID (example of first identification information), 411d: collective entrance device ID (example of second identification information), 411e: management room master device ID (example of third identification information), 413A: A/D converting section (example of first converting section), 413B: D/A converting section (example of second converting section), L1 to L5: intercom line, N: network

The invention claimed is:

1. An intercom system which is to be used in an apartment complex which is configured by a plurality of residential buildings and a centralized building that can communicate with the residential buildings, wherein
each of the residential buildings includes:
residential room master devices which are disposed in residential rooms, respectively;
a plurality of terminal devices which can communicate with the residential room master devices; and
a building controller which communicably connects the residential room master devices of the residential rooms in an own building, with the plurality of terminal devices, and
the building controller has:
first identification information that, when the centralized building is called by one of the residential room master devices via the building controller, is used in recognition in which the centralized building recognizes the building controller; and
second identification information that, when the centralized building is called by one of the residential room master devices via the building controller, is used in recognition in which the one residential room master device recognizes the building controller as a virtual terminal device that is different from the plurality of terminal devices.

2. The intercom system according to claim 1, wherein the building controller is configured so that the residential room master device of each of the residential rooms in the own building, and the plurality of terminal devices are communicably connected to each other via an intercom line, and
the plurality of residential buildings, and the centralized building are connected to each other via a network in which communication is performed in accordance with a general-purpose protocol.

3. The intercom system according to claim 2, wherein the building controller of each of the plurality of residential buildings has:
a first converting section which performs a process of converting a signal that can be communicated via the intercom line in the own building, to a signal that can be communicated via the network in accordance with the general-purpose protocol; and
a second converting section which performs a process of converting a signal that can be communicated via the network in accordance with the general-purpose protocol, to a signal that can be communicated via the intercom line in the own building.

4. The intercom system according to claim 1, wherein the plurality of terminal devices contain a collective entrance device, and,
when the centralized building is called by one of the residential room master devices via the building controller, the second identification information is used in recognition in which the one residential room master device recognizes the building controller as a virtual collective entrance device that is different from the collective entrance device.

5. The intercom system according to claim 1, wherein the plurality of terminal devices contain a management room master device, and
the building controller has third identification information that, when the centralized building is called by the management room master device via the building controller, is used in recognition in which the management room master device recognizes the building controller as a virtual management room master device that is different from the management room master device.

6. A building controller wherein the building controller has the first identification information and second identification information which are as defined in claim 1.

* * * * *